US011257916B2

(12) United States Patent
Padmanabhan et al.

(10) Patent No.: US 11,257,916 B2
(45) Date of Patent: Feb. 22, 2022

(54) ELECTRONIC DEVICE HAVING MULTI-THICKNESS GATE INSULATOR

(71) Applicant: SEMICONDUCTOR COMPONENTS INDUSTRIES, LLC, Phoenix, AZ (US)

(72) Inventors: Balaji Padmanabhan, Chandler, AZ (US); Prasad Venkatraman, Gilbert, AZ (US); Zia Hossain, Tempe, AZ (US); Donald Zaremba, Phoenix, AZ (US); Gordon M. Grivna, Mesa, AZ (US); Alexander Young, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/450,149

(22) Filed: Jun. 24, 2019

(65) Prior Publication Data

US 2020/0295149 A1 Sep. 17, 2020

Related U.S. Application Data

(60) Provisional application No. 62/818,212, filed on Mar. 14, 2019.

(51) Int. Cl.
*H01L 29/423* (2006.01)
*H01L 29/78* (2006.01)
(Continued)

(52) U.S. Cl.
CPC .. *H01L 29/42368* (2013.01); *H01L 21/76224* (2013.01); *H01L 27/2454* (2013.01);
(Continued)

(58) Field of Classification Search
CPC ............ H01L 29/42368; H01L 27/2454
See application file for complete search history.

(56) References Cited

U.S. PATENT DOCUMENTS

| 4,822,750 A | * | 4/1989 | Perlegos | ............... H01L 27/115 257/321 |
| 5,243,210 A | * | 9/1993 | Naruke | ............... H01L 29/7883 257/319 |

(Continued)

OTHER PUBLICATIONS

U.S. Appl. No. 62/818,178, filed Mar. 14, 2019, Xiaoli Wu et. al., "Insulated Gated Field Effect Transistor Structure Having Shielded Source and Method," 36 pages.

*Primary Examiner* — Ida M Soward
(74) *Attorney, Agent, or Firm* — Chamberlain Hrdlicka

(57) ABSTRACT

Systems and methods of the disclosed embodiments include an electronic device that has a gate electrode for supplying a gate voltage, a source, a drain, and a channel doped to enable a current to flow from the drain to the source when a voltage is applied to the gate electrode. The electronic device may also include a gate insulator between the channel and the gate electrode. The gate insulator may include a first gate insulator section including a first thickness, and a second gate insulator section including a second thickness that is less than the first thickness. The gate insulator sections thereby improve the safe operating area by enabling the current to flow through the second gate insulator section at a lower voltage than the first gate insulator section.

10 Claims, 17 Drawing Sheets

(51) Int. Cl.
  *H01L 29/792* (2006.01)
  *H01L 27/24* (2006.01)
  *H01L 21/762* (2006.01)
(52) U.S. Cl.
  CPC ...... *H01L 29/7802* (2013.01); *H01L 29/7813* (2013.01); *H01L 29/7827* (2013.01); *H01L 29/7926* (2013.01)

(56) References Cited

U.S. PATENT DOCUMENTS

| | | | | |
|---|---|---|---|---|
| 5,514,607 | A * | 5/1996 | Taneda | H01L 29/42328 438/259 |
| 5,747,854 | A * | 5/1998 | Gotou | H01L 21/823412 257/368 |
| 5,956,588 | A * | 9/1999 | Choi | H01L 21/28185 438/286 |
| 6,066,535 | A * | 5/2000 | Murai | H01L 21/28105 257/E21.196 |
| 6,083,791 | A * | 7/2000 | Bergemont | H01L 27/11524 257/E21.69 |
| 6,121,666 | A * | 9/2000 | Burr | H01L 29/7835 257/344 |
| 6,133,602 | A * | 10/2000 | Shrivastava | H01L 27/115 257/314 |
| 6,218,699 | B1 * | 4/2001 | Kakoschke | H01L 29/66484 257/321 |
| 6,534,364 | B1 * | 3/2003 | Erdeljac | H01L 27/115 257/E21.422 |
| 6,906,345 | B2 * | 6/2005 | Ishii | H01L 21/76243 257/342 |
| 6,943,400 | B2 * | 9/2005 | Manabe | H01L 21/28114 257/314 |
| 7,304,335 | B2 * | 12/2007 | Magri' | H01L 29/0878 257/283 |
| 7,679,137 | B2 * | 3/2010 | Lee | H01L 27/10861 257/330 |
| 7,800,177 | B2 * | 9/2010 | You | H01L 27/1255 257/347 |
| 7,948,028 | B2 * | 5/2011 | Renn | H01L 27/0922 257/330 |
| 8,022,470 | B2 * | 9/2011 | Hirler | H01L 29/407 257/328 |
| 8,253,194 | B2 * | 8/2012 | Pan | H01L 29/7813 257/332 |
| 8,343,829 | B2 * | 1/2013 | Wang | H01L 21/26586 438/243 |
| 8,405,165 | B2 * | 3/2013 | Chidambarrao | H01L 29/42368 257/402 |
| 8,643,100 | B2 * | 2/2014 | Ito | H01L 29/512 257/336 |
| 8,999,769 | B2 * | 4/2015 | Verma | H01L 29/66704 438/140 |
| 9,166,039 | B2 * | 10/2015 | Landgraf | H01L 21/0334 |
| 9,537,001 | B2 * | 1/2017 | Hao | H01L 29/063 |
| 9,773,706 | B2 * | 9/2017 | Rieger | H01L 29/66545 |
| 9,893,073 | B2 * | 2/2018 | Harada | H01L 27/11521 |
| 10,096,599 | B2 * | 10/2018 | Tsai | H01L 29/7855 |
| 10,366,895 | B2 * | 7/2019 | Laven | H01L 29/407 |
| 10,586,851 | B2 * | 3/2020 | Meiser | H01L 29/7804 |
| 10,679,699 | B2 * | 6/2020 | Tailliet | G11C 16/0408 |
| 10,700,070 | B2 * | 6/2020 | Ting | H01L 21/823437 |
| 10,720,518 | B2 * | 7/2020 | Sumitomo | H01L 29/42376 |
| 10,833,164 | B2 * | 11/2020 | Xia | H01L 29/7831 |
| 2002/0020873 | A1 | 2/2002 | Klodzinski | |
| 2004/0183119 | A1 * | 9/2004 | Negoro | H01L 29/42368 257/314 |
| 2005/0199951 | A1 * | 9/2005 | Shimizu | H01L 29/7816 257/335 |
| 2012/0319761 | A1 * | 12/2012 | Zundel | H01L 29/8611 327/530 |
| 2014/0027813 | A1 | 1/2014 | Kuruc et al. | |
| 2015/0102403 | A1 | 4/2015 | Kuruc et al. | |
| 2018/0114789 | A1 * | 4/2018 | Onishi | H01L 29/7813 |
| 2018/0175187 | A1 * | 6/2018 | Hirler | H01L 29/7802 |
| 2019/0067266 | A1 | 2/2019 | Padmanabhan et al. | |
| 2019/0378908 | A1 * | 12/2019 | Park | H01L 21/28035 |
| 2020/0259018 | A1 * | 8/2020 | Rami | H01L 29/7856 |
| 2020/0295168 | A1 * | 9/2020 | Cotorogea | H01L 29/7395 |
| 2021/0043777 | A1 * | 2/2021 | Blair | H01L 29/861 |

* cited by examiner

ELECTRONIC DEVICE HAVING MULTI-THICKNESS GATE INSULATOR

CROSS-REFERENCE TO RELATED APPLICATIONS

This application claims the benefit of U.S. Provisional Patent Application No. 62/818,212, filed on Mar. 14, 2019, the entire contents of which is incorporated herein by reference.

BACKGROUND

There are conflicting benefits in the design of semiconductor devices, such as transistors, related to the gain and the safe operating area (SOA) performance. The safe operating area is defined as the voltage and current conditions over which the devices can be expected to operate without self-damage. A high gain means that the transistor will operate efficiently, but a transistor with high gain can often mean that the range of SOA is smaller.

BRIEF DESCRIPTION OF THE DRAWINGS

Embodiments are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION OF THE DRAWINGS

One solution proposed for solving the above described issues with low SOA of a semiconductor device causing problems during saturation mode is to having a varied gate-channel structure within the semiconductor device. This varied structure creates a relationship between the gate and the channel that performs differently during the saturation mode and ohmic mode. Specifically, rather than being uniform throughout the length of the trench, the gate or the channel may have a section that has a thicker gate oxide, or has a different channel doping value to increase the SOA during saturation mode.

Figure 1:
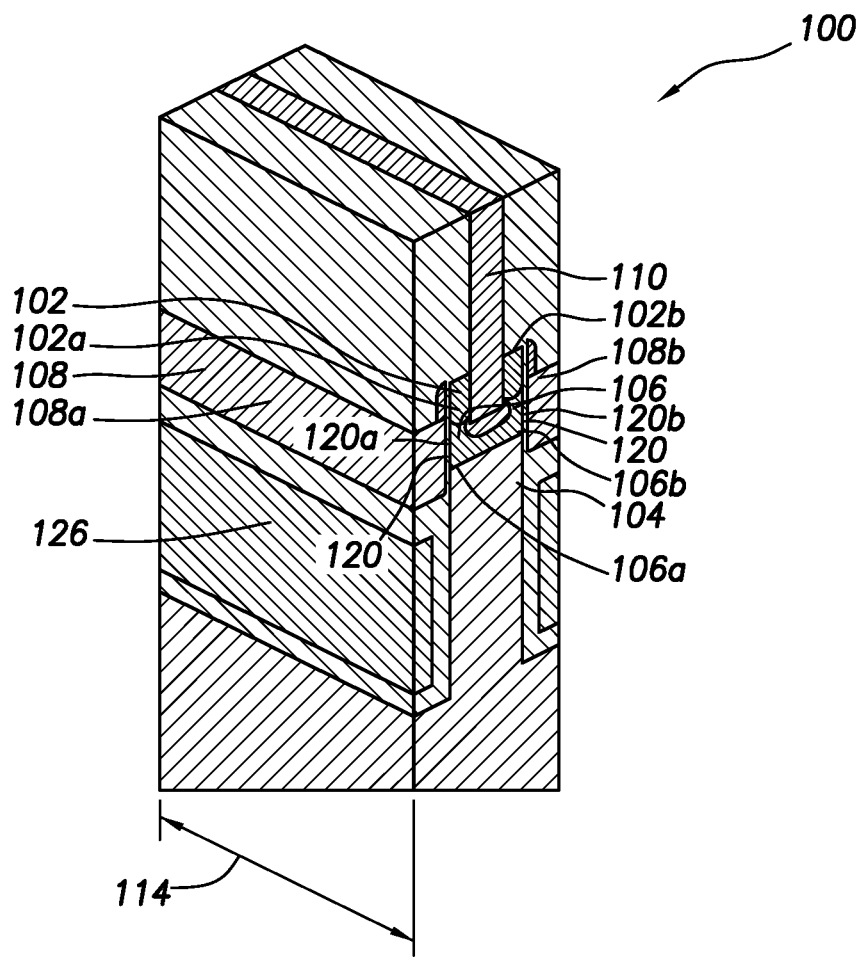
FIG. 1 is a cross-sectional schematic perspective view of an embodiment of a vertical semiconductor device.

FIG. 1 is a cross-sectional schematic perspective view of an embodiment of a vertical semiconductor device 100 that may be located in a trench extending along a length 114 as part of a device circuit that flows current to a source contact 110. The vertical semiconductor device 100 includes components for controlling the flow of a current. For example, the semiconductor device 100 includes a source 102 and a drain 104 above and below a channel region 106. The gate electrodes 108b, the current flow from drain 104 to the source 102 through the channel region 106. Shield electrodes 126 also direct the flow of current from the drain 104 to the source 102. As illustrated, each channel region 106 may include a source 102 and a gate electrode 108 on each side. The first gate electrode 108a is on the side of the channel region 106a and the gate electrode 108b is on the side of the channel region 106b. When the gate electrode 108 of the semiconductor device 100 is charged by a gate signal, a channel current through the channel region 106 is either enabled, or prevented depending on the doping of the channel region 106. That is, the channel region 106 may be doped so that current flows when the gate electrode 108 is turned on. Alternatively, the channel region 106 may be doped so that current is prevented from flowing when the gate electrode 108 is turned on.

After the signal flows through the source 102, a contact 110 conveys the signal to other devices. The semiconductor device 100 may also include trench insulating structures that prevent one semiconductor device 100 from influencing an adjacent device located in an adjacent trench.

Between the gate electrode 108 and the channel region 106, the semiconductor device 100 includes a gate insulator 120. Specifically, the first gate electrode 108a may include a first gate insulator 120a while the second gate electrode 108b may include a second gate insulator 120b.

The input/oxide capacitance of the semiconductor device is inversely proportional to the thickness of the gate insulator 120. The gain of the semiconductor device defined as the ratio of the amount of increase in output current to the increase in gate voltage. This gain of the semiconductor device is directly proportional to the input capacitance of the device. Therefore, in order to enable a good SOA performance, the gain of the device has to be reduced by increasing the gate oxide thickness. However, increasing the gate oxide thickness to reduce the gain of the semiconductor device results in an increase of the on resistance of the device at a certain gate voltage. This will negatively impact the performance of the device in various applications.

Figure 2:
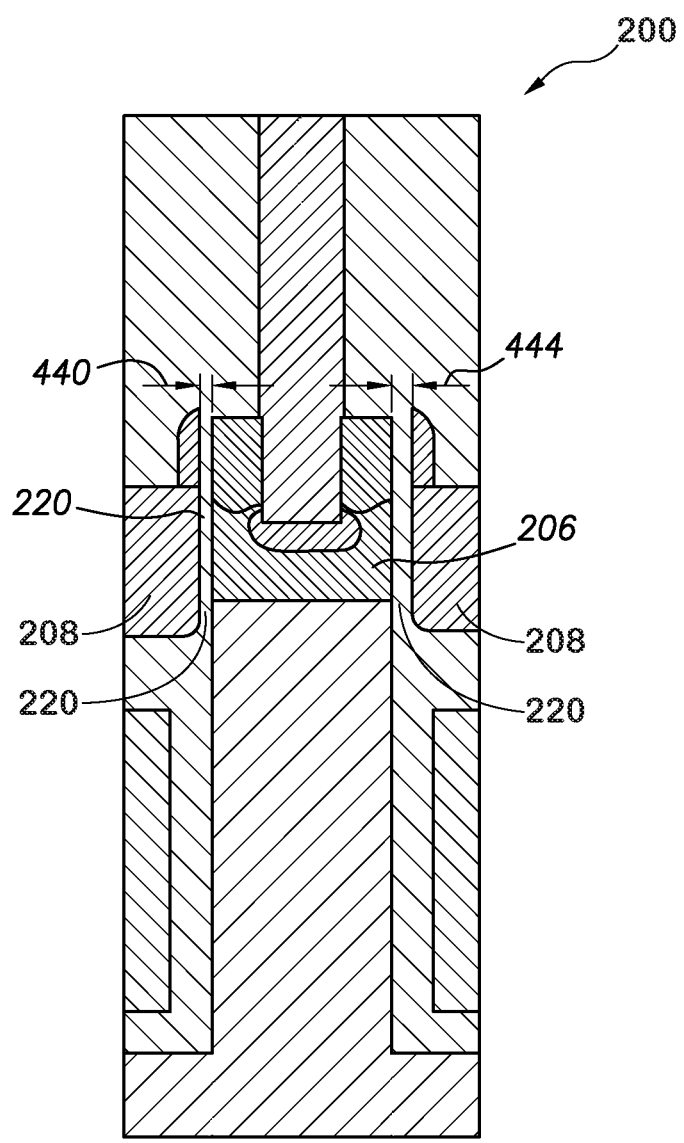
FIG. 2 is a cross-sectional schematic side view of an embodiment of a vertical semiconductor device having a varied gate oxide thickness.

Thus it is beneficial to have a semiconductor device that can incorporate a feature that reduces the gain of the device to improve SOA performance and also reduces the impact to application performance in certain modes of operation. As disclosed herein, this can be accomplished by including variations in the relationship between the gate electrode 108 and the channel region 106. FIG. 2 illustrates an example of variations that improve the performance of the SOA by reducing the gain of a semiconductor device 200. Specifically, gate insulators 220 between gate electrodes 208 and a channel region 206 include varying thicknesses on either side of the channel region 206. That is, the thickness differs between one side of the channel region 206 and the other side of the channel region 206. The left side of FIG. 2 has the smaller thickness 440 while the right side of FIG. 2 has the thicker second thickness 444. The differences in the thickness may be located for the entire length (i.e., into the page of FIG. 2) of the gate electrode 208 or the channel region 206, or may be different for only portions of the length.

Figure 3:
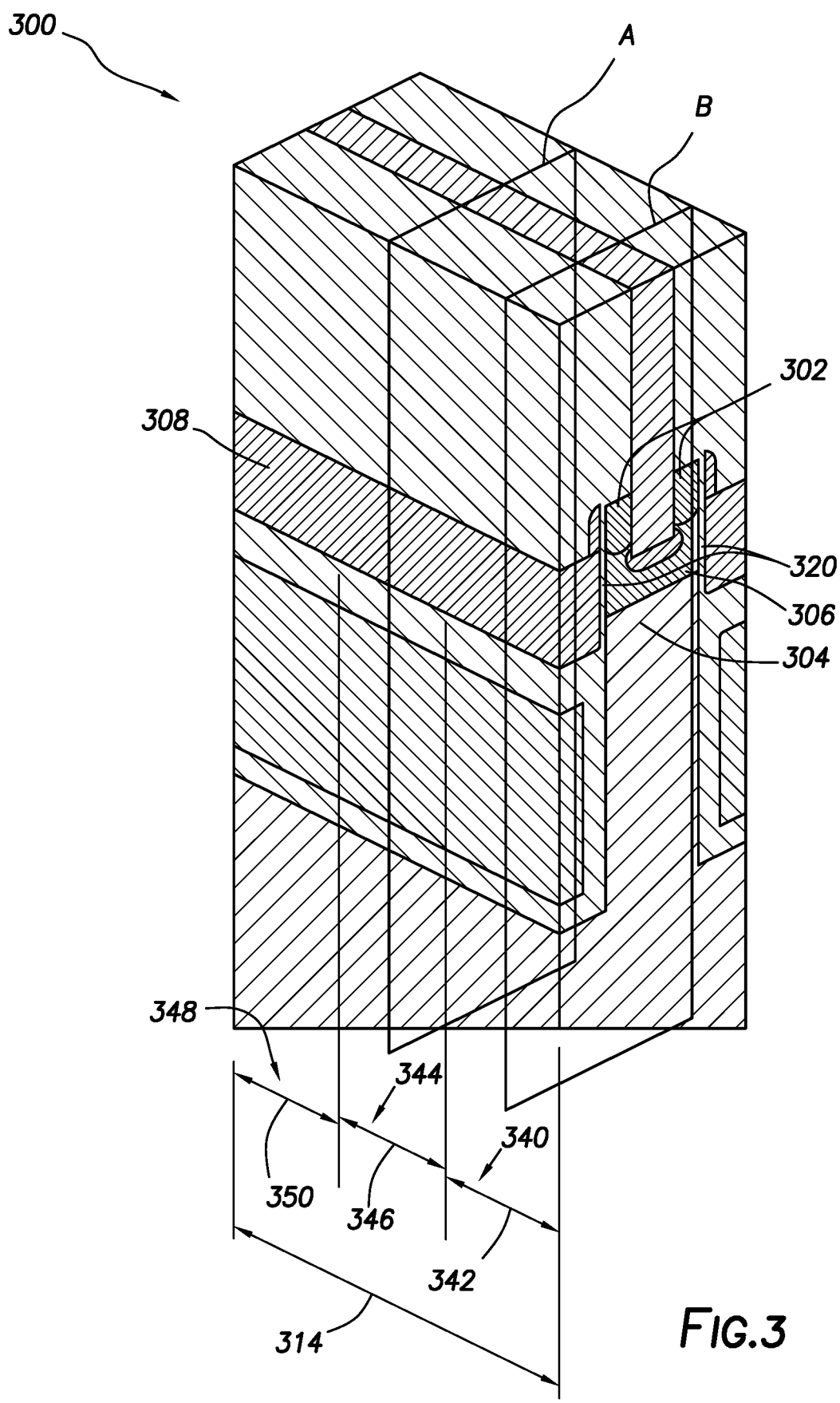
FIG. 3 is a cross-sectional schematic perspective view of an embodiment of a vertical semiconductor device having varied gate oxide thickness along each side of a channel region.

FIG. 3 is a cross-sectional schematic perspective view of an embodiment of a vertical semiconductor device 300 having varied gate oxide thickness along each side of a channel region. The varied gate oxide may improve the performance of the SOA by reducing the gain of the semiconductor device. Specifically, a gate insulator 320 between a gate electrode 308 and a channel 306 includes a varying thickness along the length of the channel or the length 314 of the trench.

The increase in gate insulator thickness in certain regions of the semiconductor device reduces the gain of the device and improves SOA performance. The threshold voltage of the semiconductor device defined as the gate voltage at which the channel 320 turns on and current flows from the drain 304 to the source 302. The threshold voltage in the local regions where the gate insulator thickness is increased also increases. Therefore, for a given gate voltage, the regions with thin gate insulator (which will have lower threshold voltage) will turn on and the regions with thick gate insulator will be off. Since the width of the channel that contributes to current flow is reduced at this gate voltage, the on resistance of the semiconductor device increases. However, by having the drift region 304 (part of the drain region) common along the trench for both the thick and thin gate insulator regions, the negative impact to on resistance of the device is reduced. When the gate voltage is increased, the regions with thick oxide also turn on and further reduce the negative impact to on resistance of the semiconductor device.

A first section 340 of the gate insulator 320 has a first length 342. The first section 340 may have a first gate thickness 440 (shown in FIG. 4B). A second section 344 of the gate insulator 320 has a second length 346. The second section 344 may have a second gate thickness 444 (shown in FIG. 4A). The first thickness 440 may be between 150 and 1000 angstroms, or more particularly 475 angstroms. The second thickness 444 may be between 100 and 2000 angstroms, or more particularly 475 angstroms. A third section 348 may have a third length 350 and may include a thickness that is the same as the first thickness 440, or a different thickness. The first length 342, the second length 346, and the third length 350 may be the same, for example, 0.5 microns. In certain embodiments, the first length 342 is longer that the second length 346, and in certain embodiments the first length 342 is shorter that the second length 346.

Figure 4A:
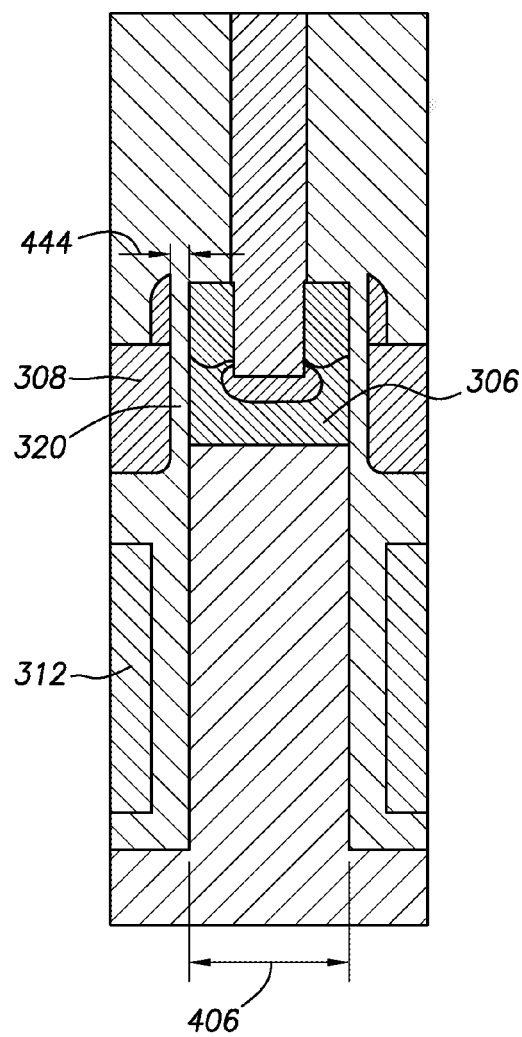
FIGS. 4A-4B are cross-sectional schematic side views of an embodiment of a vertical semiconductor device having varied gate oxide thickness along a length of the channel.
Figure 4B:
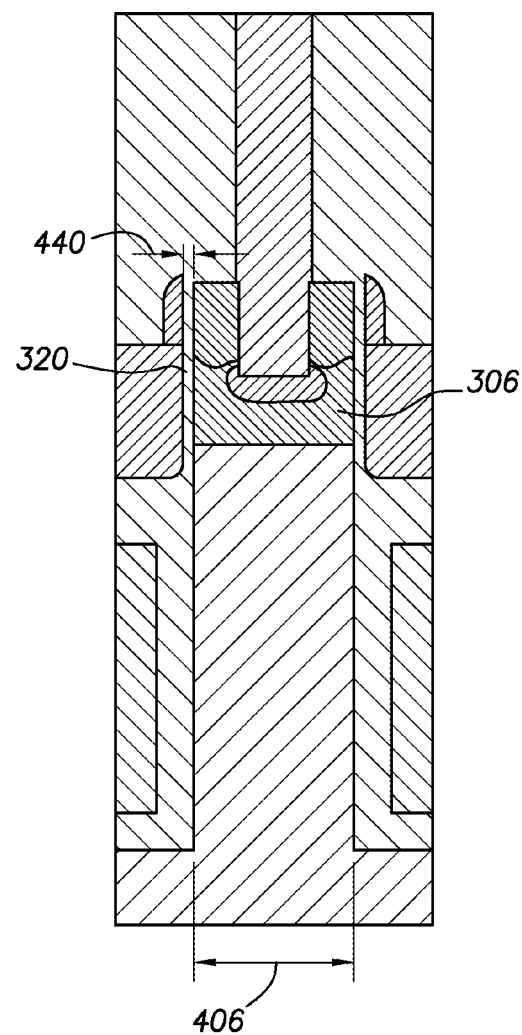

FIGS. 4A-4B are cross-sectional schematic side views of the embodiment of the vertical semiconductor device 300 of FIG. 3. FIG. 4B shows a smaller first thickness 440 between a gate electrode 308 and a channel 306. FIG. 4A shows a thicker second thickness 444 such that the gate electrode 308 is located further from the channel 306. Thus, in this embodiment a channel dimension 406 is the same along the channel 306 (i.e., into the page in FIGS. 4A and 4B). However, in certain embodiments, variations in the gate electrode 308 combined with sections of thicker gate insulator create a channel dimension 406 that varies along the channel 306 to account for the thicker gate insulator 320.

Figure 5A:
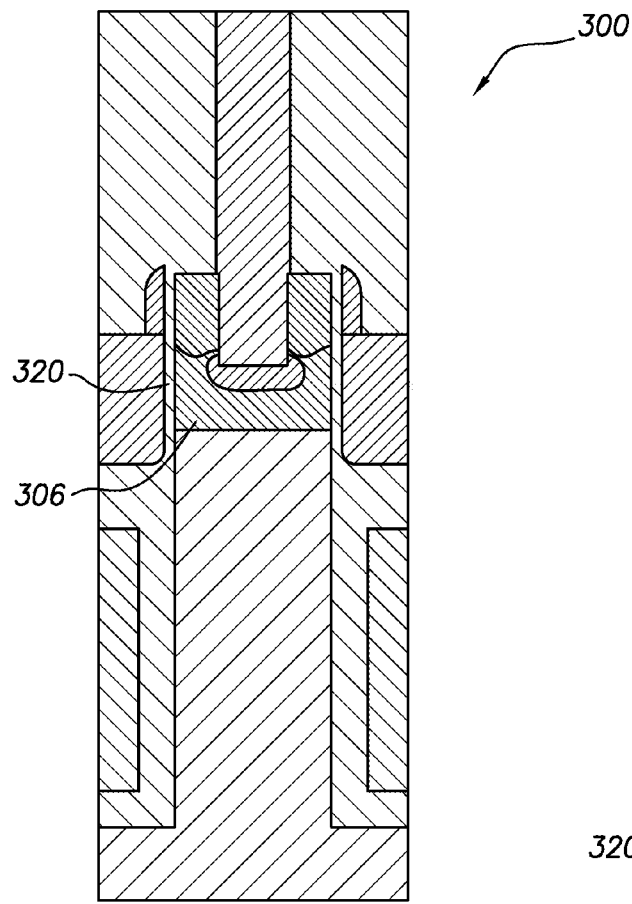
FIGS. 5A-5B are cross-sectional schematic side views of an embodiment of a vertical semiconductor device having varied doping levels along a length of the channel.
Figure 5B:
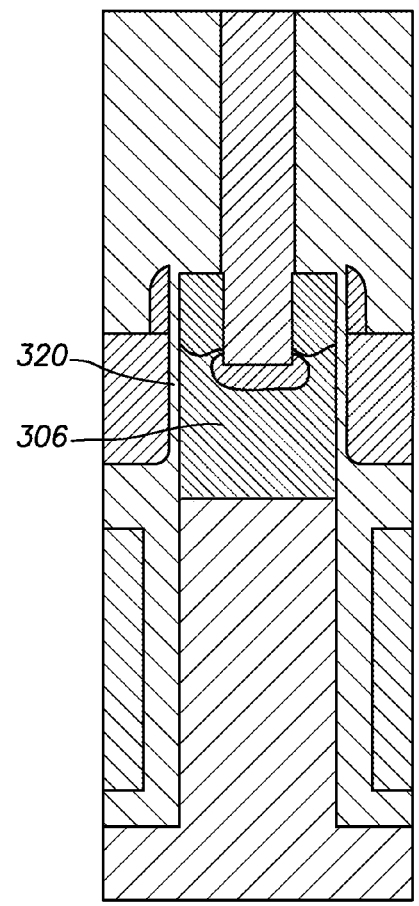

FIGS. 5A-5B are cross-sectional schematic side views of an embodiment of the vertical semiconductor device 300 having varied doping levels along a length 314 of the channel 306. As illustrated, in the first section 340 of the gate insulator 320, the channel 306 has a first doping level, while in the second section 344 of the gate insulator 320, the channel 306 has a second doping level. The second section 344 may have a doping level that increases the gate voltage that is required to turn on the channel 306. When the device is operating in saturation mode or lower gate voltage, the sections with higher doping are turned off and the effective channel length of the device is reduced. This reduces the gain of the device and improves its SOA performance. The gate insulator thicknesses of FIGS. 4A-4B, in certain embodiments, may be combined with the varied doping levels of FIGS. 5A-5B.

Figure 6A:
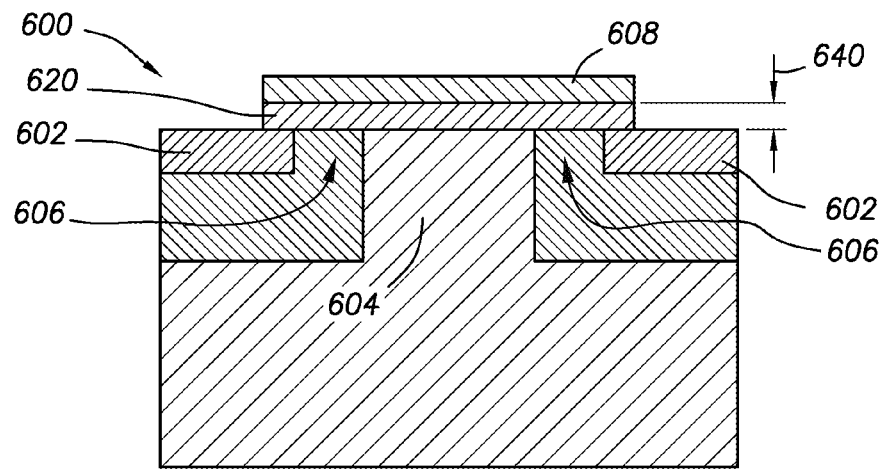
FIGS. 6A-6C are cross-sectional schematic side views of an embodiment of a planar semiconductor device having varied gate oxide thickness along a length of the channel.
Figure 6B:
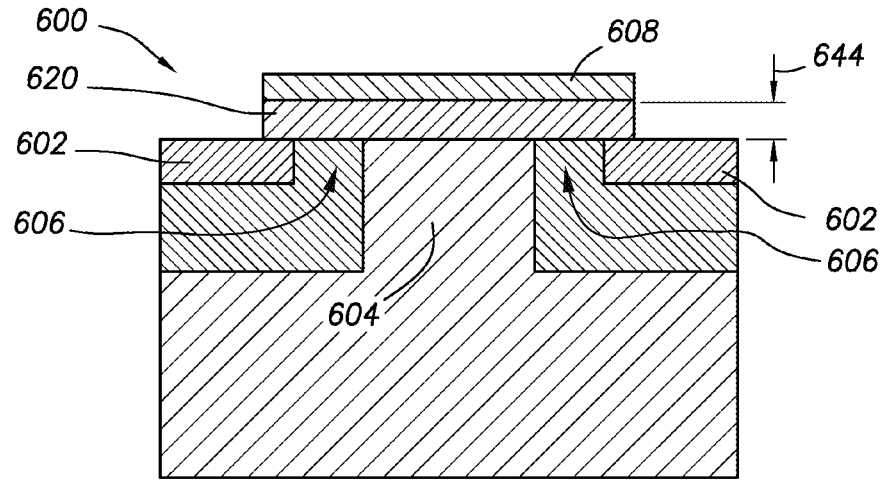
Figure 6C:
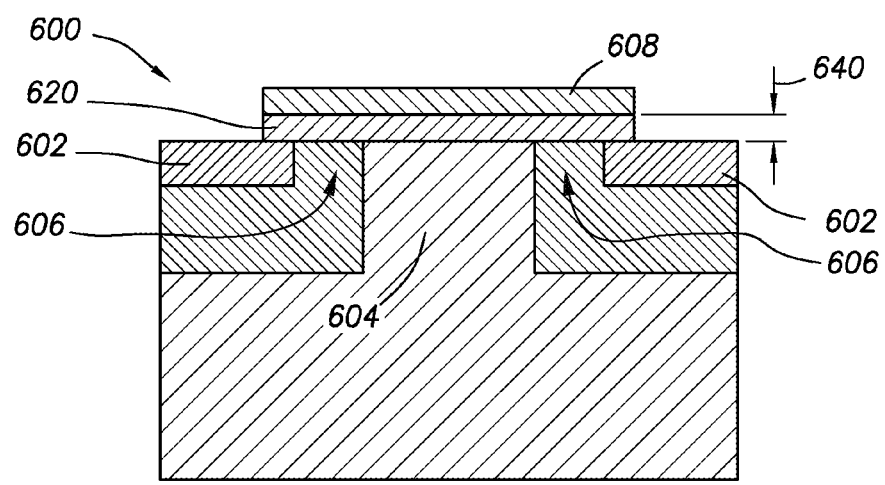

FIGS. 6A-6C are cross-sectional side views of an embodiment of a planar semiconductor device 600 having a varied gate insulator 620. The planar semiconductor device 600 includes a source 602, a drain 604, and a channels 606. These components operate similarly to the source, drain, and channel in the embodiments above. FIG. 6A, for example, illustrates a cross-section of a first section of the planar semiconductor device 600 where a gate electrode 608 operates on the channels 606 through a gate insulator 620 having a first thickness 640. When a voltage is applied to the gate electrode 608 that is higher than the threshold voltage, an inversion region is created in the channels 606 that enables a channel current to flow from drain to source.

FIG. 6B illustrates a second section of the semiconductor device 600 that has the same source 602, drain 604, and channels 606 as FIG. 6A. In the second section, however, the gate insulator 620 has a second thickness 644 that is thicker than the first thickness 640. FIG. 6C illustrates a third section of the semiconductor device 600 that also has the same source 602, drain 604, and channels 606 as FIG. 6A, but the gate insulator 620 has the first thickness 640 that is thinner than the second thickness 644. A length of each of the sections may be tuned to optimize the SOA performance for the planar semiconductor device 600. For example, in device architectures that are, the second section having the second thickness 644 may be longer than the first section and the third section. On the other hand, in some device architectures the second section may be manufactured to be shorter than the first and third sections.

Figure 7A:
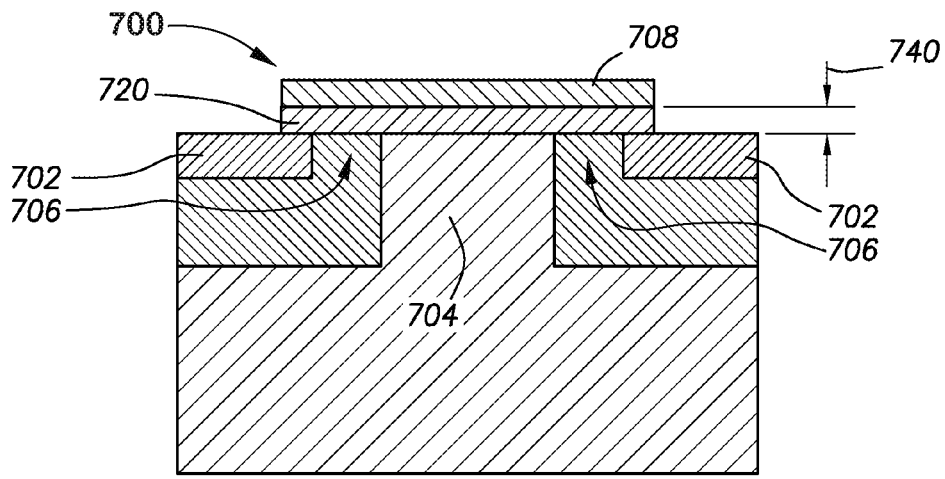
FIGS. 7A-7C are cross-sectional schematic side views of an embodiment of a planar semiconductor device having varied gate oxide thickness along a length of the channel.
Figure 7B:
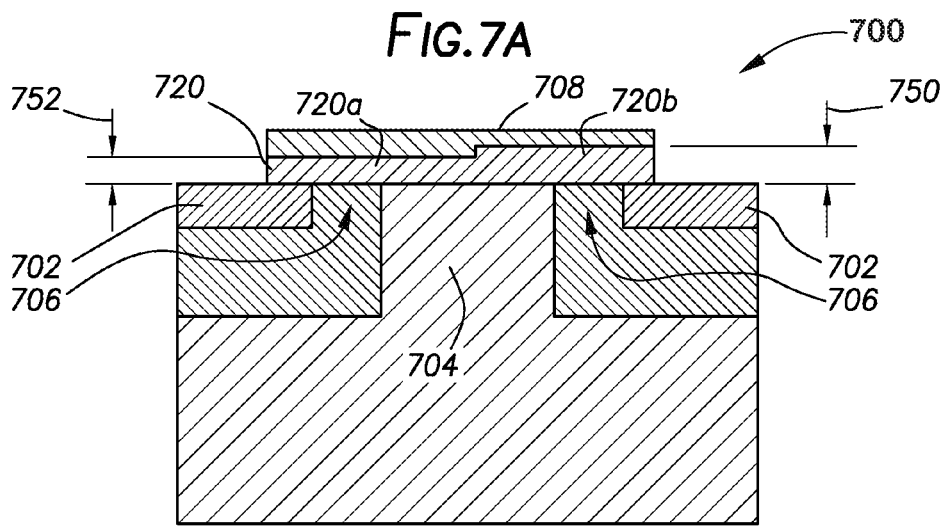
Figure 7C:
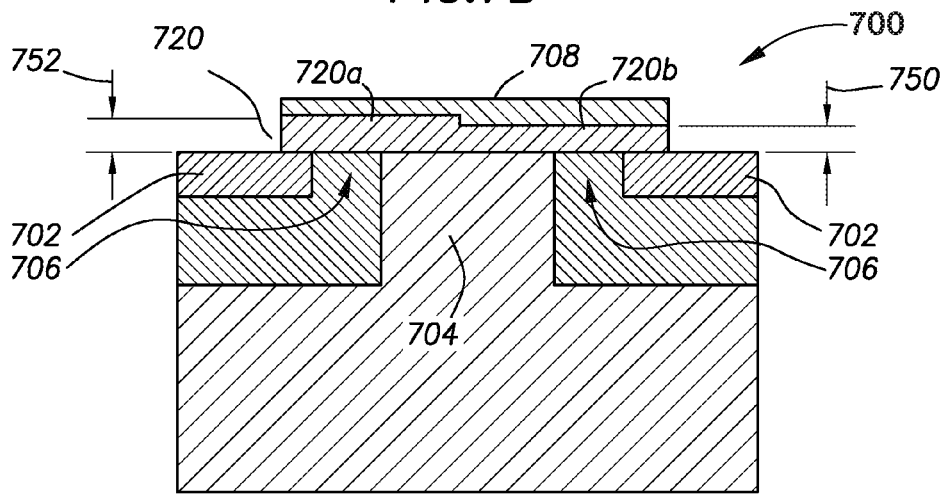

FIGS. 7A-7C are cross-sectional side views of an embodiment of a planar semiconductor device 700 having a gate insulator 720a, 720b with varying thicknesses on each side of a drain 704. The planar semiconductor device 700 includes a source 702, a drain 704, and channels 706. These components operate similarly to the source, drain, and channels in the embodiments above. FIG. 7A, for example, illustrates a cross-section of a first section of the planar semiconductor device 700 where a gate electrode 708 operates on the channels 706 through a gate insulator 720 having a first thickness 740. When the gate electrode 708 is engaged, an inversion region is created in the channels 706 that enables current to flow. Unlike the embodiment of a planar semiconductor device 600 of FIGS. 6A-6C, however, the second section of the planar semiconductor device 700 has two different thicknesses. The left insulator thickness 752 has the same value as the first thickness 740, but the right insulator thickness 750 has a thickness value that is greater than the 740 in FIG. 7B. In the third section of the device, shown in FIG. 7C, the right insulator thickness 750 has the same value as the first thickness 740 but the left insulator thickness 752 has a thickness value that is greater than the 740.

Figure 8A:
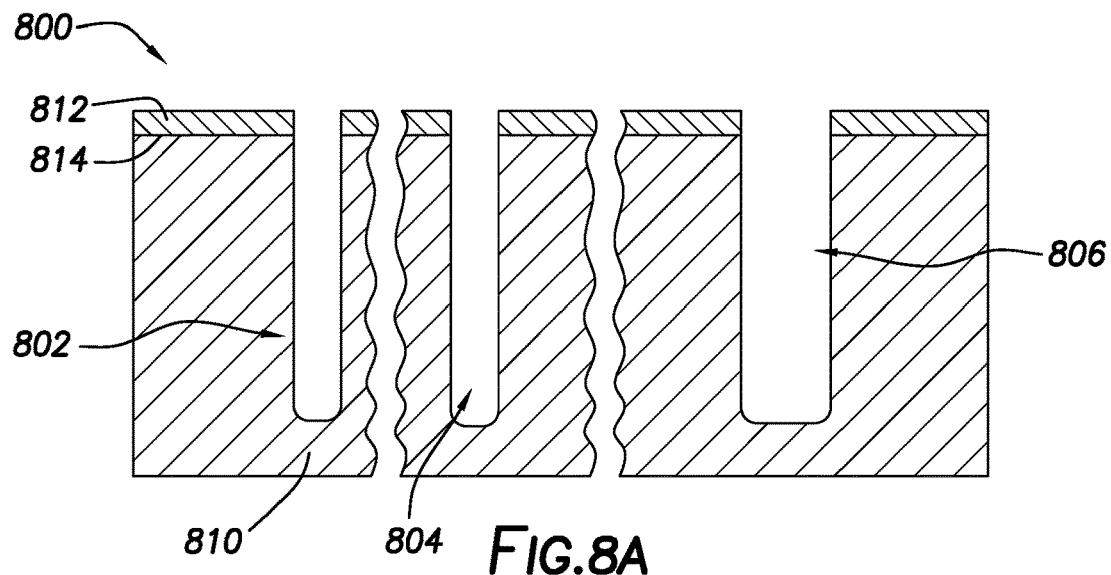
FIGS. 8A-8S are cross-sectional schematic side views of an embodiment of a vertical semiconductor device at different temporal points during fabrication of the vertical semiconductor device.
Figure 8B:
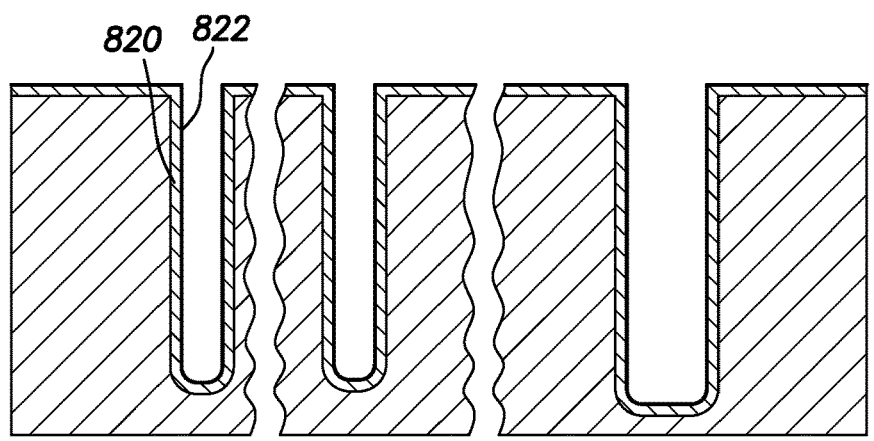
Figure 8C:
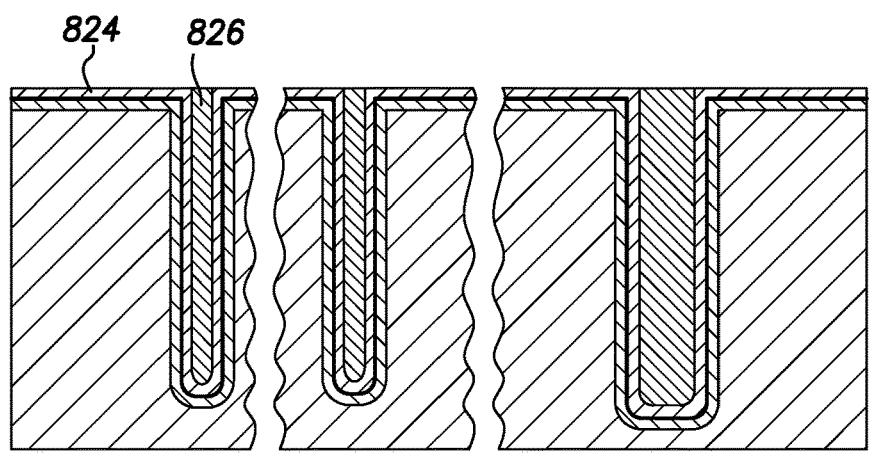
Figure 8D:
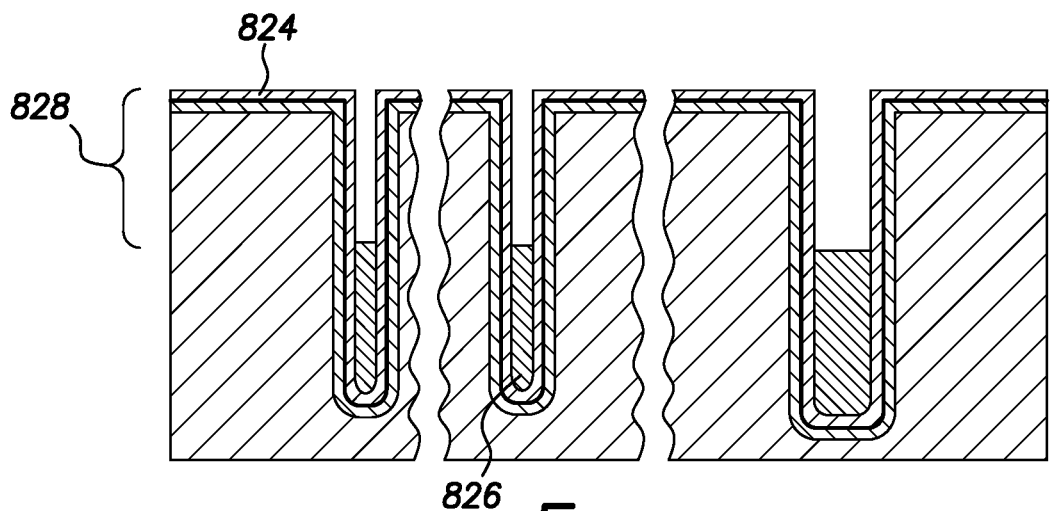
Figure 8E:
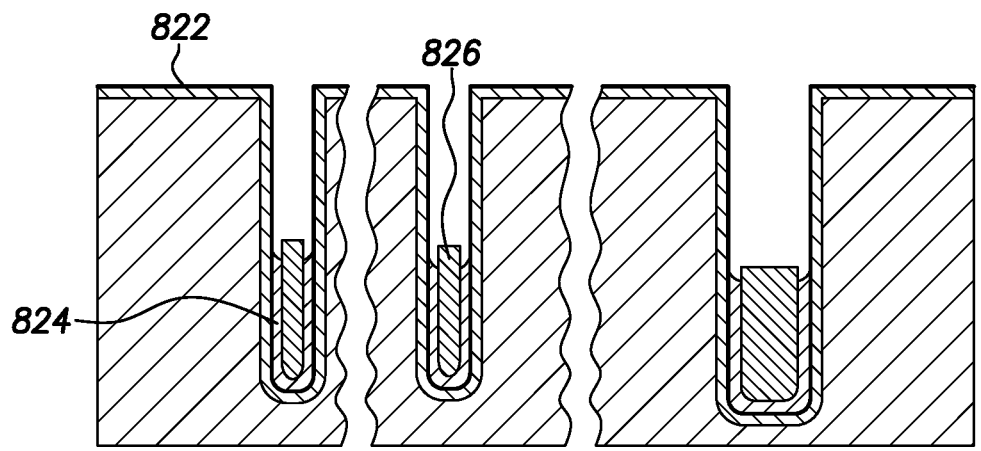
Figure 8F:
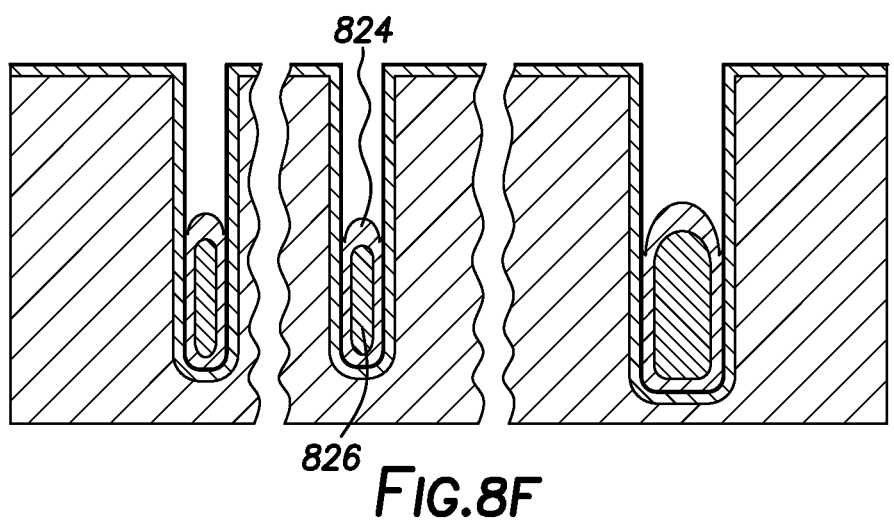
Figure 8G:
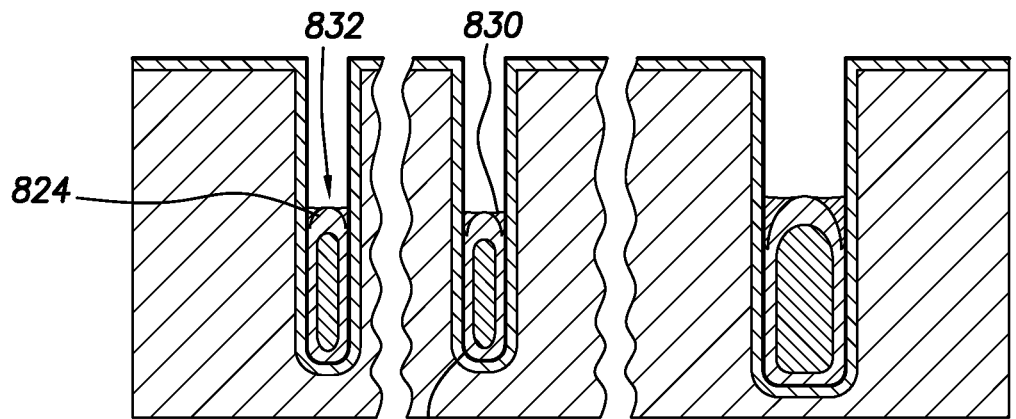
Figure 8H:
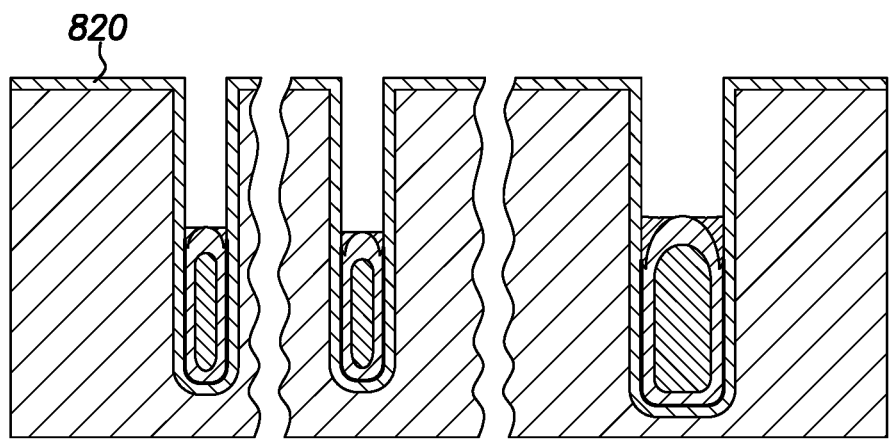
Figure 8I:
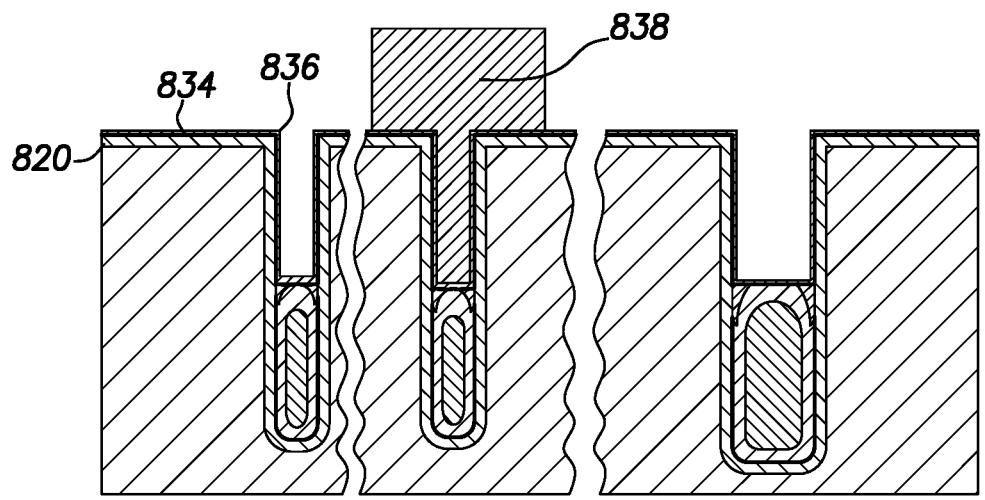
Figure 8J:
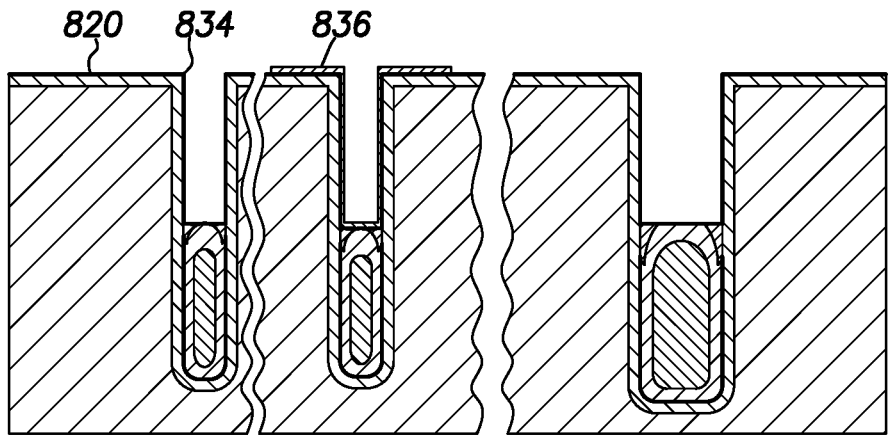
Figure 8K:
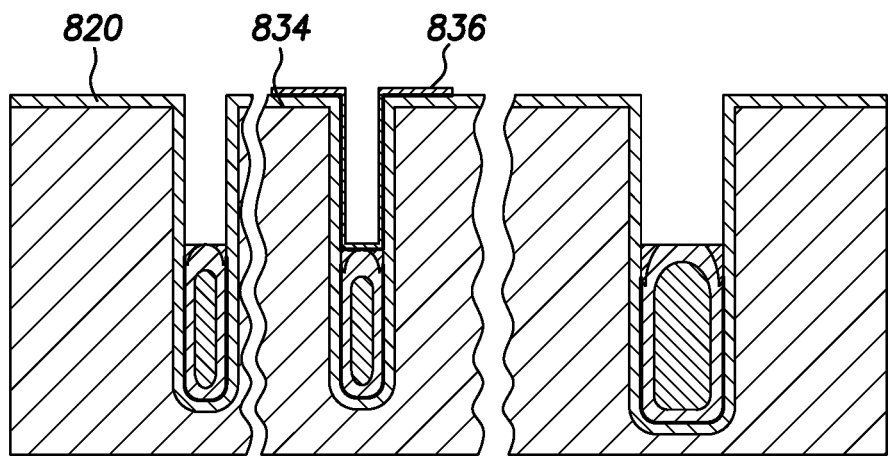
Figure 8L:
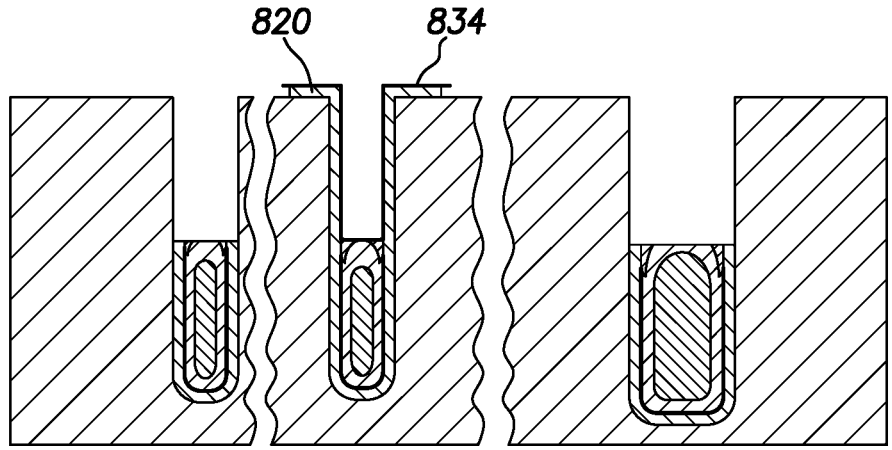
Figure 8M:
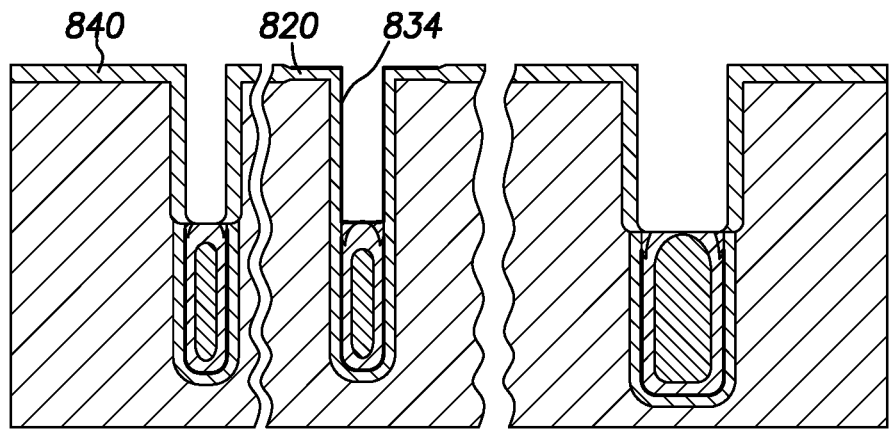
Figure 8N:
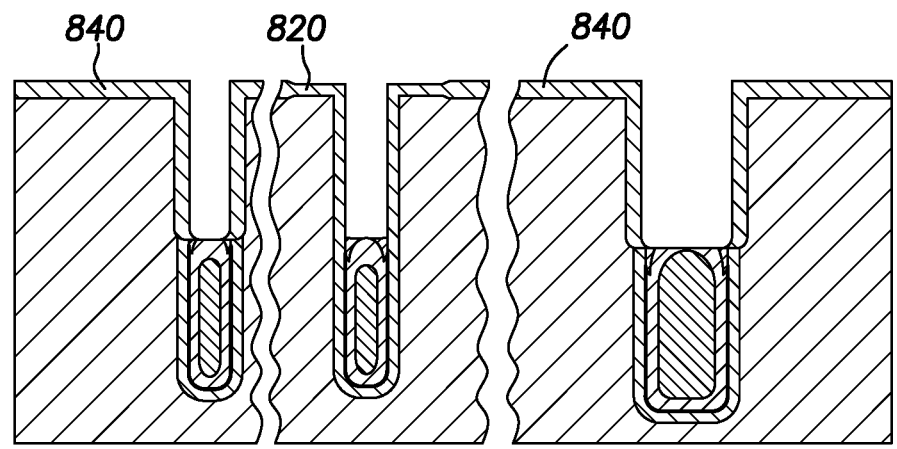
Figure 8O:
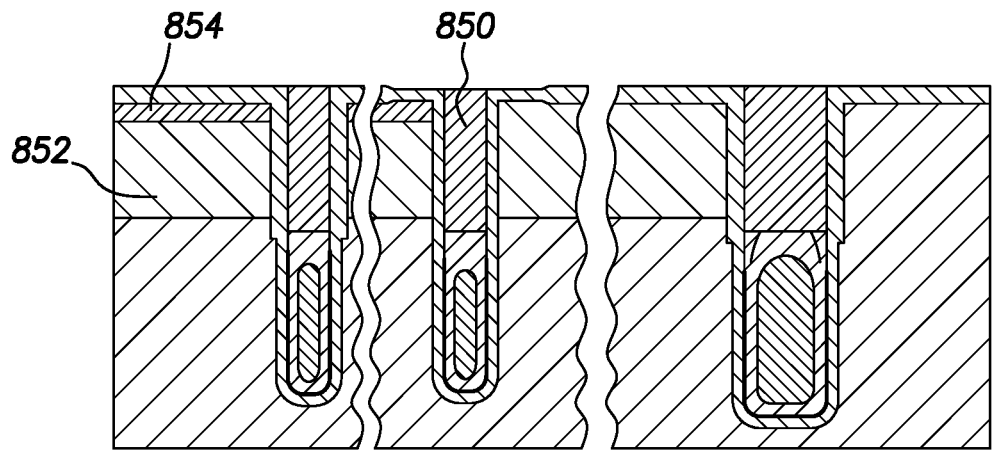
Figure 8P:
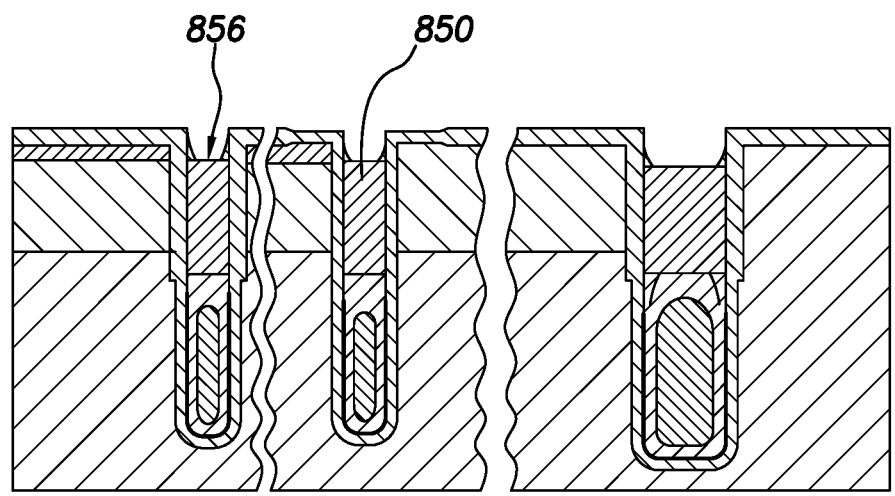
Figure 8Q:
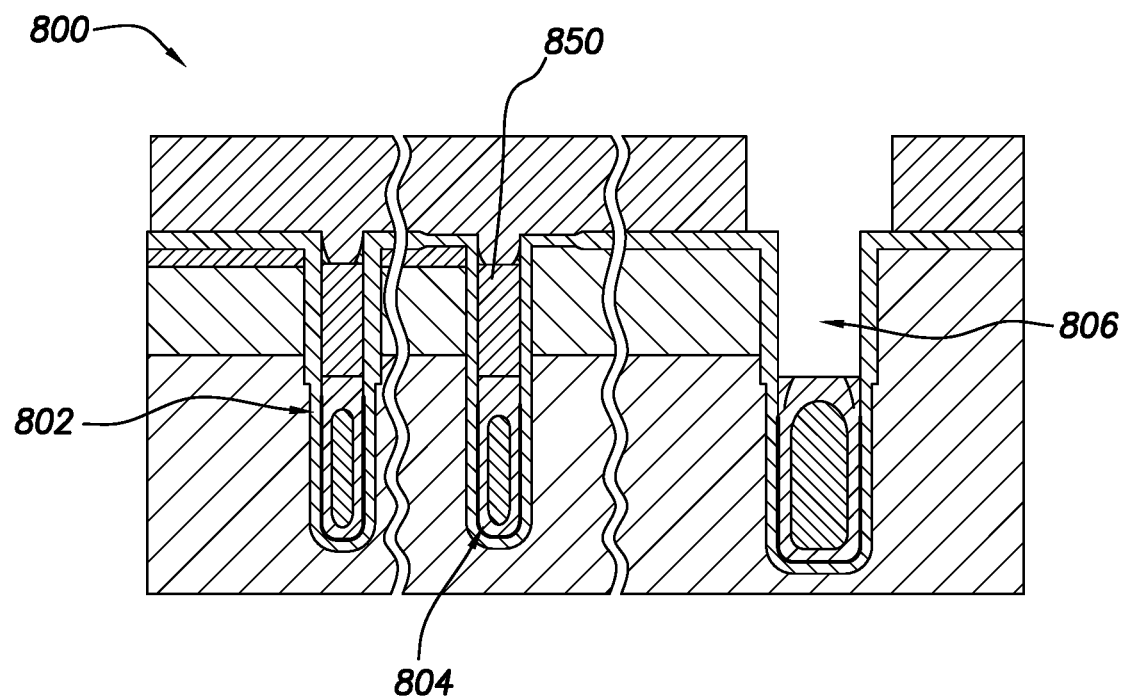
Figure 8R:
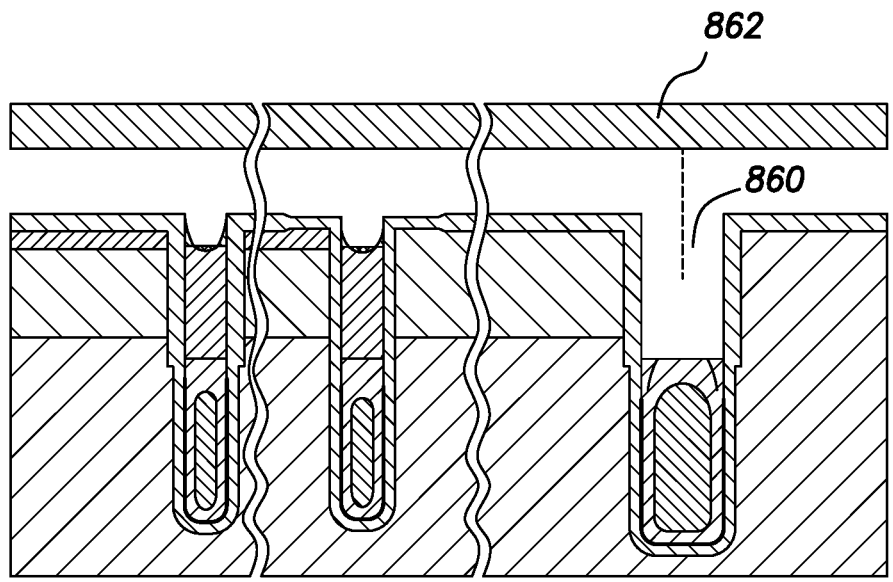
Figure 8S:
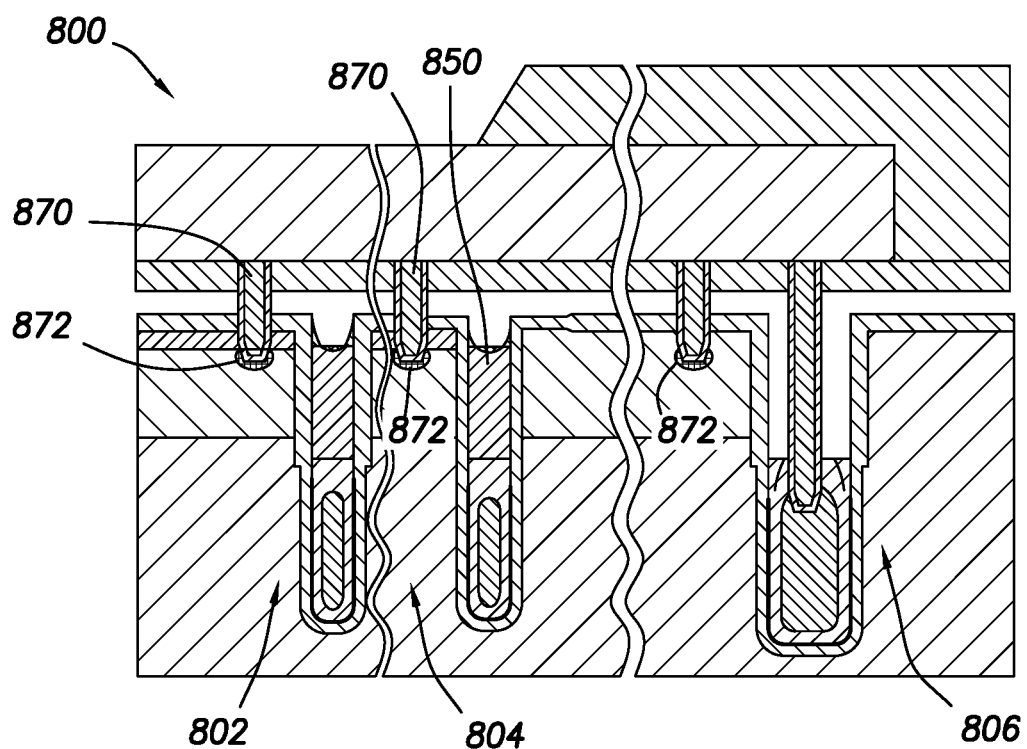

FIGS. 8A-8S are cross-sectional side views of an embodiment of a trench structure 800 of a semiconductor device being fabricated through multiple steps. The trench structure 800 may be one of a plurality of trench structures forming the semiconductor devices described above. Each following figure illustrates the following step in the process. Each figure also includes a first section 802, a second section 804, and a third section 806 of the same trench structure 800.

FIG. 8A shows a substrate 810 that has had an oxide 812 patterned onto a top surface 814. The oxide 812 may be patterned, for example, using a photolithographic resist layer. After the oxide 812 is patterned the trench structure 800 is etched into the substrate 810. In FIG. 8B, the trench structure 800 has the oxide 812 removed, and a gate oxide or a gate insulator 820 applied to each section (i.e., 802, 804, 806) of the trench structure 800. The oxide 820 may be grown on the substrate 810, or deposited by other known methods.

Additionally, a nitride shielding layer 822 may be applied to the gate insulator 820 as well. In FIG. 8C, the trench structure 800 is lined with a layer of oxide 824 and then filled with polysilicon material 826 which will eventually become the shield electrode. In FIG. 8D some of the polysilicon material 826 is removed from a depth 828 within the oxide 824. In FIG. 8E, a portion of the oxide 824 is removed. The removal of the oxide 824 may be done using a wet etch technique that does not affect the nitride shielding layer 822. The removal of the oxide 824 is timed to end such that some of the oxide 824 remains around the poly silicon trench insulating structures 826 at the bottom of the trench structure 800. The polysilicon trench insulating structures 826, as illustrated, may protrude from the oxide 824. Subsequently, as shown in FIG. 8F, an additional covering of oxide 824 may be grown on the polysilicon trench insulating structures 826 within the trench structure 800. The additional covering of oxide 824 may include a separate step, shown in FIG. 8G that fills in gaps 830 left on the sides of the oxide 824 such that a flat boundary 832 of oxide 824 is left above the polysilicon trench insulating structures 826.

In FIG. 8H, the exposed portions of the shielding layer 822 may be removed from the insulator 820. The trench structure 800 may be annealed at this point to improve homogeneity of the substrate 810 and deposited layers. A new shielding layer 834 may then be added, as illustrated in FIG. 8I. This shielding layer 834 may be a different pattern than the first shielding layer 822, or may be applied universally to the semiconductor device having the trench structure 800. FIG. 8I also shows a thin oxide layer 836 and a representative photolithographic pattern 838 that protects the thin oxide layer 836 from removal, as shown in FIG. 8J.

Thus, the first section 802 and the third section 806 do not have the thin oxide layer 836, while the second section 804 has the thin oxide layer 836. All sections (i.e., 802, 804, 806) are still lined with the shielding layer 834. In FIG. 8K, the shielding layer 834 is removed from all areas that were not covered by the thin oxide layer 836, and then, as shown in FIG. 8L, all the oxide 824 that is not covered by the shielding layer 834 is removed. This removal includes the thin oxide layer 836, but not the oxide 824 beneath what had been the thin oxide layer 836. A thick oxide layer 840 is then grown in and on the trench structure 800 as shown in FIG. 8M. The thick oxide layer 840 is not grown on the shielding layer 834, which thus retains the thinner insulator/oxide 820. As illustrated in FIG. 8N the shielding layer 834 is removed, which leaves a layer of oxide having two thicknesses: a thinner oxide/insulator 820, and a thick oxide 840.

FIG. 8O illustrates the trench structure 800 with varied gate thicknesses along the length. The trench structure 800 also includes a gate electrode fill 850 and doped regions 852, 854. The doped regions 852, 854 may be doped by implanting ions into the substrate 810 at specific concentrations and depths. The implantation may be done through the oxide layers 820, 840. The gate electrode fill 850 may subsequently be etched to form a recess 856 as shown in FIG. 8P. FIG. 8Q shows that the gate electrode fill 850 may be etched away from the third section 806 of the trench structure 800 while leaving the gate electrode fill 850 in the first section 802 and the second section 804. This enables a deeper protective layer 860 in the third section 806 as illustrated in FIG. 8R. The protective layer 860 may be covered by a nitride deposition 862. FIG. 8S illustrates a finished embodiment of the trench structure 800 including contacts 870 protruding into the third section 806 of the trench structure 800 and to a source 872 adjacent to the first section 802 and the second section 804.

Figure 9A:
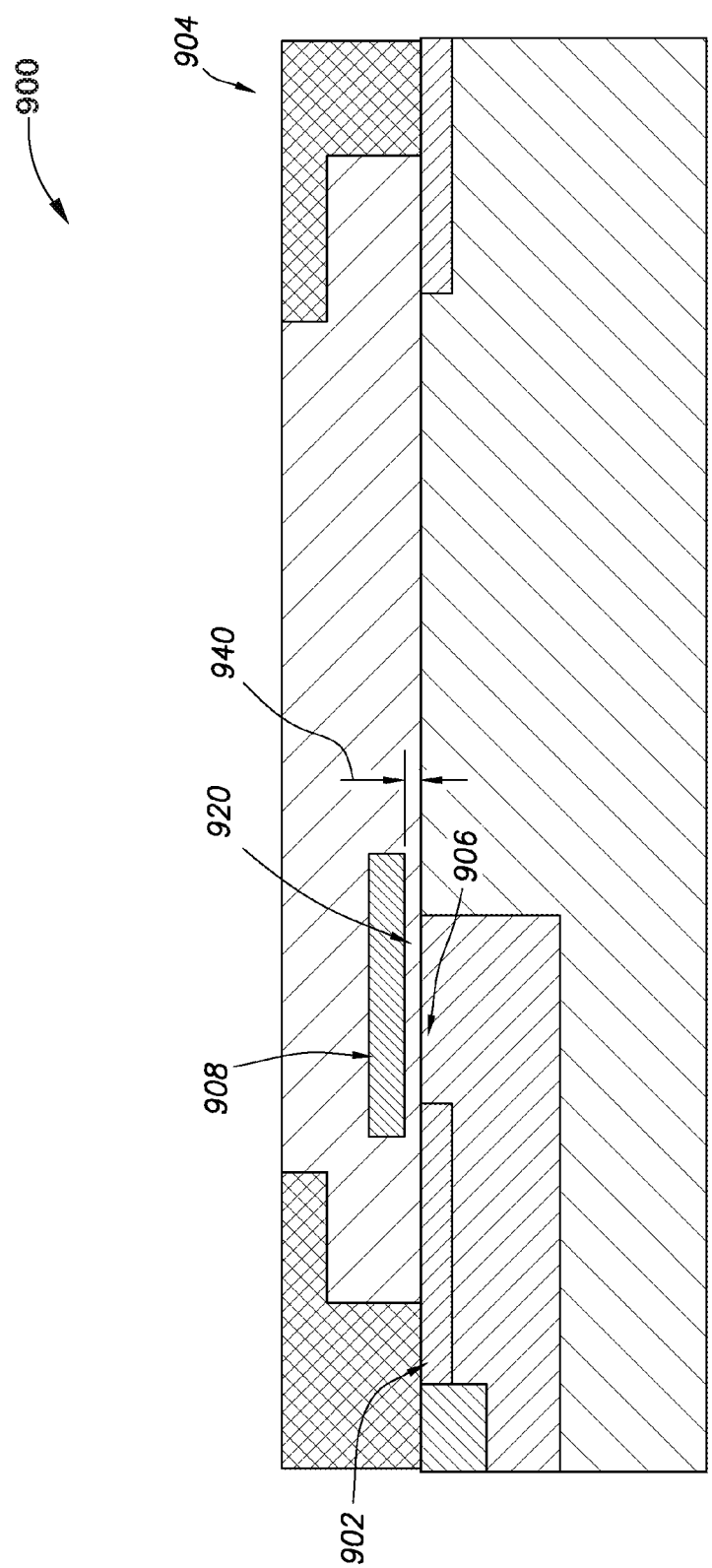
FIGS. 9A-9B are cross-sectional schematic side views of an embodiment of a lateral semiconductor device having varied gate oxide thickness along a length of the channel.
Figure 9B:
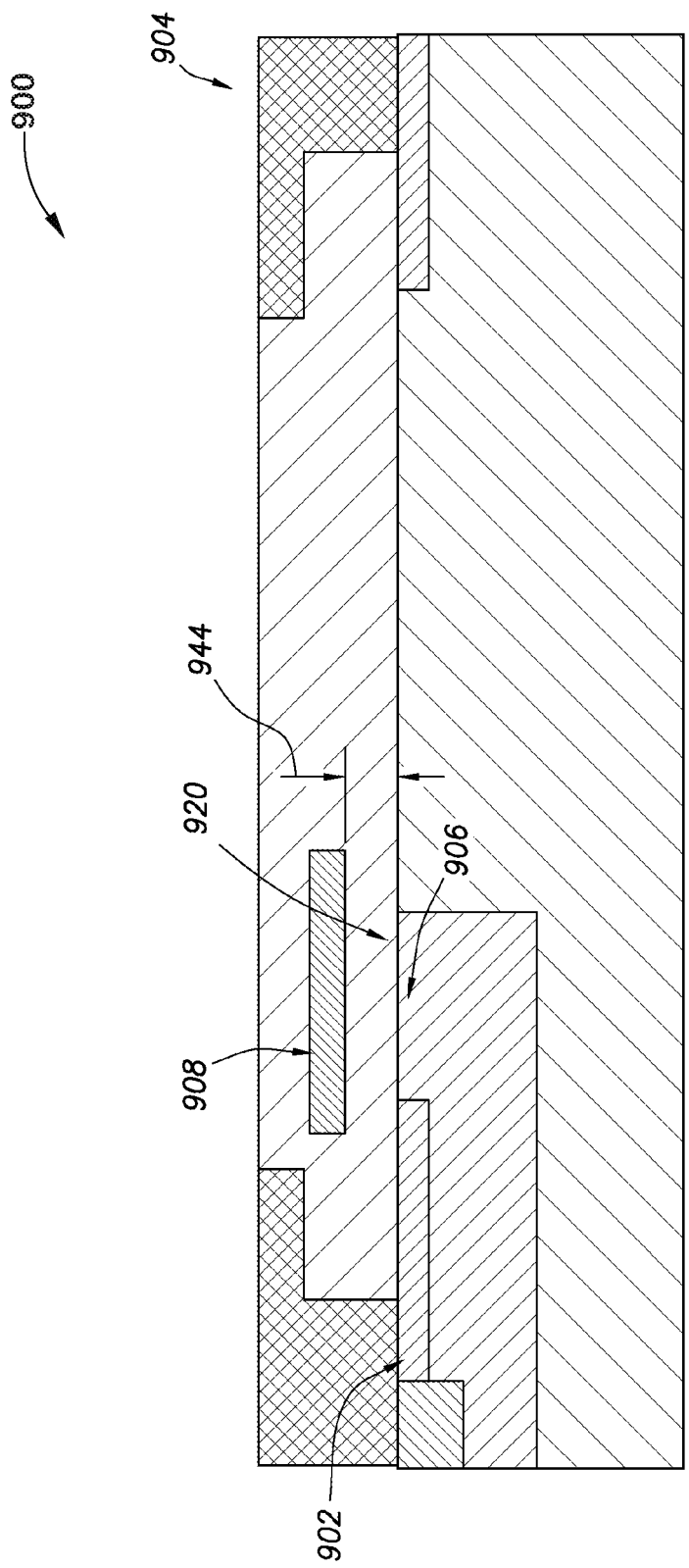

FIGS. 9A-9B are cross-sectional side views of an embodiment of a lateral semiconductor device 900 having a varied gate insulator 920 along a channel length. The lateral semiconductor device 900 includes a source 902, a drain 904, and a channel 906. These components operate similarly to the source, drain, and channel in the embodiments above. FIG. 9A, for example, illustrates a cross-section of a first section of the lateral semiconductor device 900 where a gate electrode 908 operates on the channel 906 through a gate insulator 920 having a first thickness 940. When the gate electrode 908 is engaged, an inversion region is created in the channel 906 that enables a channel current to flow from drain 904 to source 902.

FIG. 9B illustrates a second section of the semiconductor device 900 that has the same source 902, drain 904, and channel 906 as FIG. 9A. In the second section, however, the gate insulator 920 has a second thickness 944 that is thicker than the first thickness 940. A length of each of the sections may be tuned to optimize the SOA performance for the lateral semiconductor device 900. For example, in device architectures that are, the second section having the second thickness 944 may be longer than the first section and the third section. On the other hand, in some device architectures the second section may be manufactured to be shorter than the first and third sections.

Figure 10:
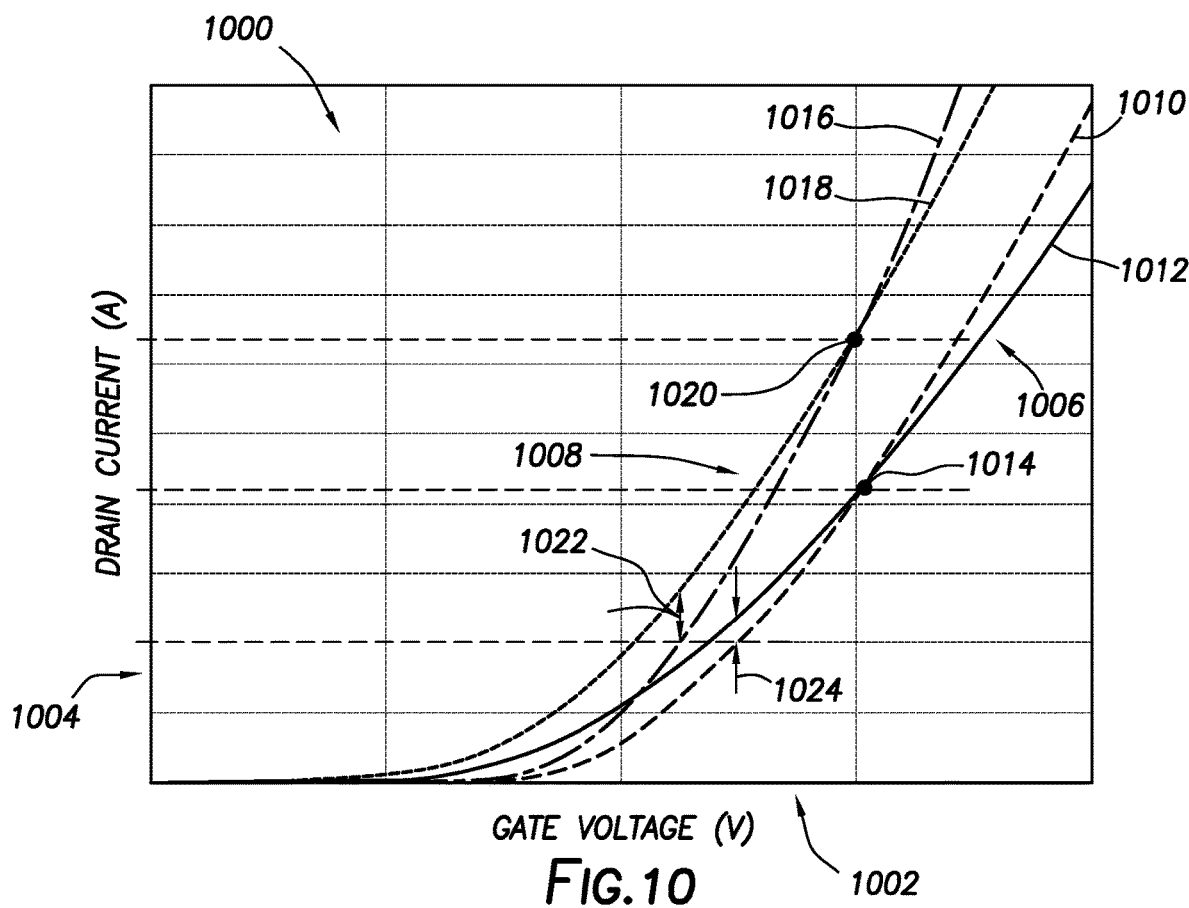
FIG. 10 is a graphical view of a relationship between gate voltage and drain current comparing an embodiment of a varied channel-gate structure and an embodiment of an un-varied channel-gate structure.

FIG. 10 is a graphical view 1000 of relationships between gate voltage 1002 and drain current 1004 comparing an embodiment of a varied channel-gate structure 1006 (e.g., as described in the embodiments below) and an embodiment of an un-varied channel-gate structure 1008. As shown, the drain current 1004 increases more slowly for a given gate voltage 1002 for the varied channel-gate structure 1006 than for the un-varied channel-gate structure 1008. This reduction in gain of the device (i.e., slope) of the curve helps in improving the SOA performance of the semiconductor device.

Furthermore, the benefits of better temperature management are also evident in the graph 1000. Specifically, in the varied channel-gate structure 1006, lines showing a lower temperature performance 1010 and a higher temperature performance 1012 cross at an intercept point 1014. Likewise, the un-varied channel-gate relationship 1008 also shows a lower temperature performance 1016 and a higher temperature performance 1018 and an intercept point 1020. The intercept 1014, 1020 is important because a semiconductor device has a tendency to heat up during operation. If the semiconductor device increases the current with temperature, (as is the case with gate voltages 1002 to the left of the intercept point 1014, 1020) then the temperature can rapidly increase to the point of affecting the functionality of the semiconductor device. Above the intercept point 1014, 1020 (i.e., to the right) the current decreases with temperature, slowing down the increase in temperature and rarely affecting the functionality of the semiconductor device. Therefore, it is beneficial to have an intercept point 1014, 1020 that occurs at as low a current 1004 as possible to allow the semiconductor device to operate in a larger range of output current.

Thus, the varied gate-channel relationship is beneficial to the semiconductor device because the intercept point is at a low current, and the varied channel-gate structure 1006 will have better performance during saturation for a larger range in operating current.

Additionally, semiconductor devices benefit from operation that is consistent along a wide range of temperatures due to increased heat dissipative characteristics. This consistency, as illustrated in FIG. 1B, is more closely aligned for the varied channel-gate structure 1006 than for the un-varied channel-gate structure 1008. Specifically, in certain embodiments a difference 1022 between the lower temperature performance 1016 and the higher temperature performance 1018 for the un-varied channel-gate structure 1008 may be a maximum of 5-10 A, or more particularly 7.6 A, while a difference 1024 between the lower temperature performance 1010 and the higher temperature performance 1012 for the varied channel-gate structure 1006 may be 3-5 A, and more particularly 4.3 A. The particular structure of embodiments of varied channel-gate structures are given in the examples below.

What is claimed is:

1. An electronic device, comprising:
   a first gate electrode configured to supply a gate voltage;
   a source;
   a drain;
   a channel doped to enable a current to flow from the drain to the source when a voltage is applied to the first gate electrode; and
   a first gate insulator between the channel and the first gate electrode comprising:
      a first gate insulator section along a first length of the first gate insulator in which an entire width of the first gate insulator between the first gate electrode and the channel comprises a first thickness; and
      a second gate insulator section along a second length of the first gate insulator comprising a second thickness that is different than the first thickness.

2. The device of claim 1, wherein the first length is longer than the second length.

3. The device of claim 1, wherein the first length is shorter than the second length.

4. The device of claim 1, wherein the electronic device comprises a vertical structure, wherein the drain, channel, and source enable the current to flow vertically through the channel.

5. The device of claim 1, wherein the electronic device comprises a lateral structure, wherein the drain, channel, and source enable the current to flow laterally through the channel.

6. The device of claim 1, comprising a shield electrode.

7. The device of claim 1, comprising a second gate electrode on an opposite side of the channel from the first gate electrode.

8. The device of claim 7, further comprising a second gate insulator between the second gate electrode and the channel having a fourth thickness different from the first thickness or the second thickness.

9. The device of claim 1, wherein the first gate insulator section comprises a first doping level, and the second gate insulator section comprises a second doping level that is different from the first doping level.

10. The device of claim 1, wherein the first gate insulator comprises a third gate insulator section comprising a third thickness, wherein the third thickness is different than the first thickness or the second thickness.

* * * * *